US008498110B2

United States Patent
Wei

(10) Patent No.: US 8,498,110 B2
(45) Date of Patent: Jul. 30, 2013

(54) CONTAINER DATA CENTER

(75) Inventor: Chao-Ke Wei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/221,880

(22) Filed: Aug. 30, 2011

(65) Prior Publication Data
US 2013/0050923 A1 Feb. 28, 2013

(30) Foreign Application Priority Data

Aug. 23, 2011 (TW) .............................. 100130059 A

(51) Int. Cl.
H05K 7/20 (2006.01)
(52) U.S. Cl.
USPC ............. 361/679.5; 361/679.48; 361/679.51; 361/679.53; 361/695; 361/696; 361/699; 165/80.2; 165/104.33; 165/104.34; 165/121; 165/185; 454/184; 454/237
(58) Field of Classification Search
USPC ................... 361/70–715, 717–728; 165/80.2, 165/80.3, 80.4, 80.5, 104.33, 104.34, 121–126, 165/185; 312/223.2, 236, 265.1, 265.3, 265.4, 312/265.5; 206/320; 454/184, 118, 230, 237, 454/239, 289; 29/592, 592.1; 62/59, 135, 62/137, 259.2
See application file for complete search history.

(56) References Cited

U.S. PATENT DOCUMENTS

| 7,278,273 | B1 * | 10/2007 | Whitted et al. | 62/259.2 |
| 7,738,251 | B2 * | 6/2010 | Clidaras et al. | 361/701 |
| 7,961,463 | B2 * | 6/2011 | Belady et al. | 361/695 |
| 7,971,446 | B2 * | 7/2011 | Clidaras et al. | 62/259.2 |
| 7,990,710 | B2 * | 8/2011 | Hellriegel et al. | 361/699 |
| 8,233,270 | B2 * | 7/2012 | Pierson et al. | 361/679.02 |
| 8,238,082 | B2 * | 8/2012 | Salpeter | 361/679.02 |
| 8,297,067 | B2 * | 10/2012 | Keisling et al. | 62/228.1 |
| 8,300,402 | B2 * | 10/2012 | Wei | 361/679.47 |
| 8,320,128 | B2 * | 11/2012 | Wei | 361/695 |
| 8,331,087 | B2 * | 12/2012 | Wei | 361/679.5 |
| 8,411,439 | B1 * | 4/2013 | Carlson et al. | 361/699 |
| 2010/0051563 | A1 * | 3/2010 | Schreiber | 211/26 |
| 2010/0130117 | A1 * | 5/2010 | Larsen | 454/184 |
| 2012/0142265 | A1 * | 6/2012 | Wei | 454/184 |
| 2012/0276834 | A1 * | 11/2012 | Peng et al. | 454/184 |

* cited by examiner

Primary Examiner — Michail V Datskovskiy
(74) Attorney, Agent, or Firm — Altis Law Group, Inc.

(57) ABSTRACT

A container data center includes a container and a number of information processing systems arranged in two rows. The container includes a top wall, a bottom wall opposite to the top wall, and opposite sidewalls connected between the top wall, the bottom wall, and a raised floor supporting the information processing systems. Each of the sidewalls defines an outlet and an intake respectively to above and below the raised floor. Two groups of the fans respectively are mounted in the air outtake holes of the container. Two air ducts are respectively arranged between the sidewalls and the rows of the data processing systems. Air outside the container flows into the container through the intake to cool the information processing systems, and is guided to the corresponding outlets by the air ducts to be exhausted out of the container by the fans.

7 Claims, 2 Drawing Sheets

CONTAINER DATA CENTER

CROSS-REFERENCE OF RELATED APPLICATION

Relevant subject matter is disclosed in a pending U.S. patent application, titled "CONTAINER DATA CENTER" with the application Ser. No. 12/981,553, filed on Dec. 30, 2010, which is assigned to the same assignee as this patent application.

BACKGROUND

1. Technical Field

The present disclosure relates to data centers, and particularly to a container data center.

2. Description of Related Art

With increasing heavy duty use of on-line applications, the need for computer data centers has increased rapidly. Data centers are centralized computing facilities that include many information processing devices, often arranged on server racks or shelves, and one rack or shelf with some information processing devices can be considered an information processing system. During operation, information processing systems generate a lot of heat in the data centers, and a common method for dissipating the heat involves using air conditioners, and mounting a number of fans in each of the information processing devices. It is very expensive to purchase and operate the air conditioners and a large number of fans. Therefore an economic, energy-saving heat dissipation system for the data center is desired.

BRIEF DESCRIPTION OF THE DRAWING

Many aspects of the present embodiments can be better understood with reference to the following drawing. The components in the drawing are not necessarily drawn to scale, the emphasis instead being placed upon clearly illustrating the principles of the present embodiments.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Figure 1:
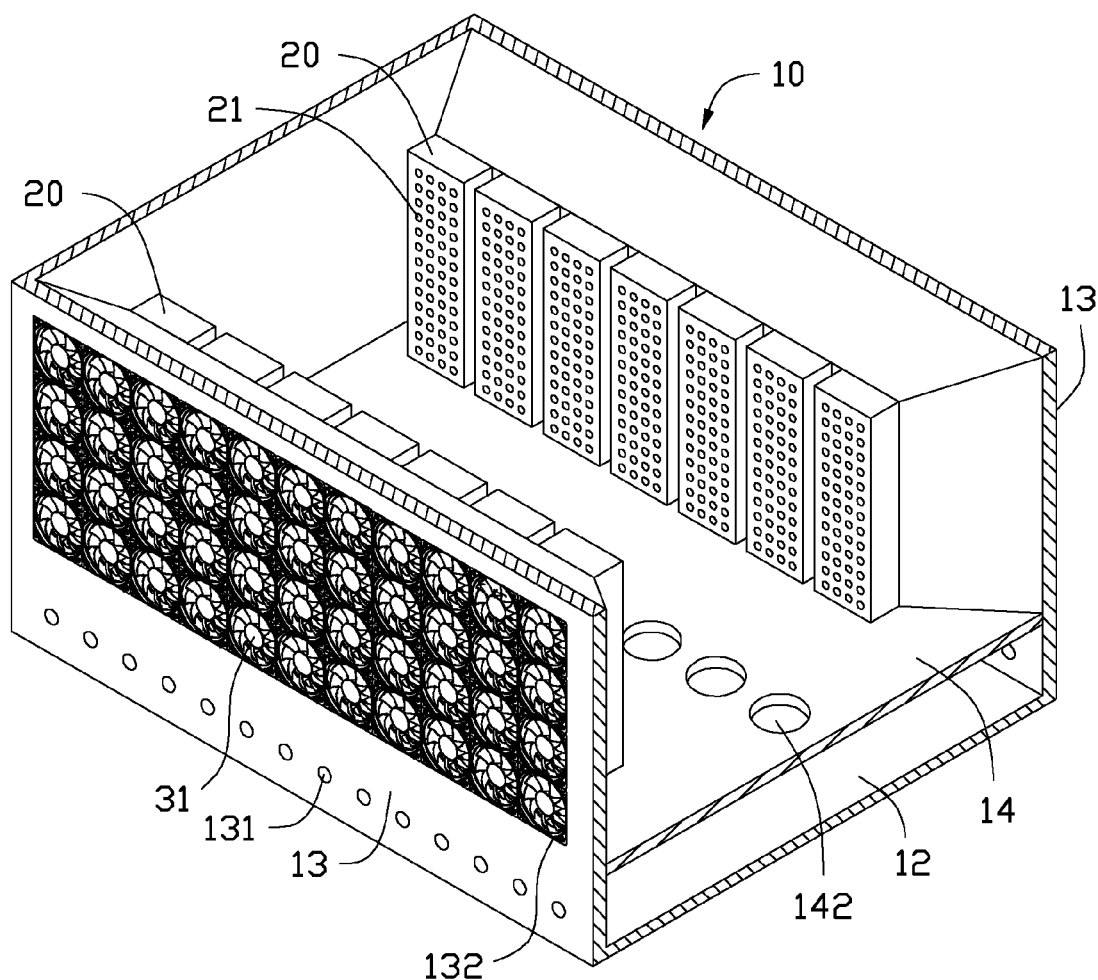
FIG. 1 is a cut-away, isometric view of an embodiment of a container data center.
Figure 2:
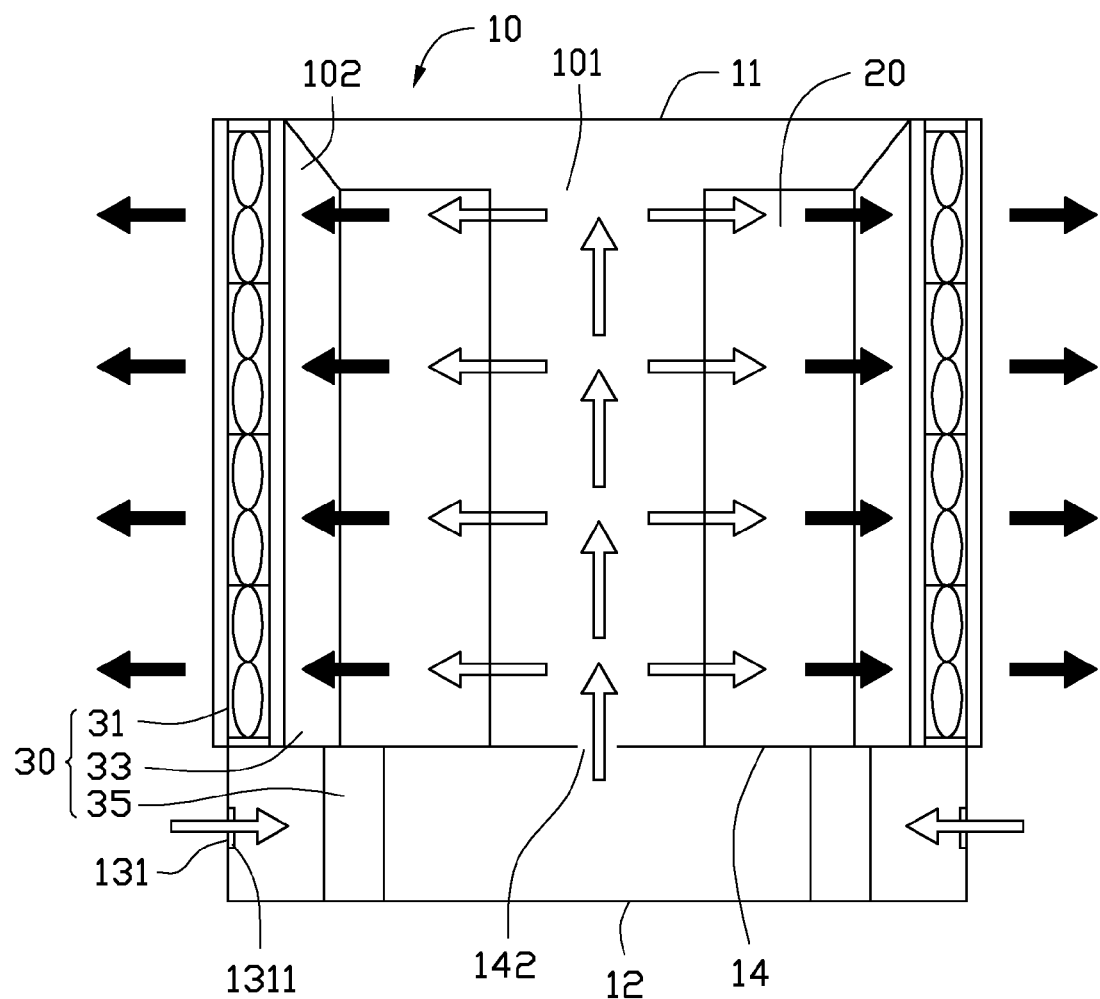
FIG. 2 is a cross-sectional, schematic view of an embodiment of a container data center.

Referring to the FIGS. 1 and 2, an embodiment of a container data center includes a container 10, a plurality of information processing systems 20 installed in the container 10, and a heat dissipation system 30 mounted in the container 10. The information processing systems 20 are arranged in two parallel rows.

The container 10 can be carried and transported with trucks, ships or other transportation means. The container 10 includes a top wall 11, a bottom wall 12, opposite sidewalls 103 substantially perpendicularly connected between corresponding sides of the top wall 11, the bottom wall 12, and a raised floor 14 parallel and close to the bottom wall 12. Each of the sidewalls 13 defines a plurality of intakes 131 arranged under the raised floor 11, and a big sized outlet 132 above the raised floor 14. In one embodiment, a plurality of air filters 1311 are attached to the sidewalls 13 of the container 10 to correspondingly cover the intakes 131, thereby preventing dust entering the container 10. The information processing systems 20 are supported on the raised floor 14. The raised floor 14 defines an opening 112 between the two rows of information processing systems 20.

Each of the information processing systems 20 includes a plurality of information processing devices, such as computer servers. In one embodiment, none of the information processing systems 20 is equipped with fans, but a plurality of vents 21 is defined in opposite sides of each of the information processing systems 20.

The heat dissipation system 30 includes two groups of fans respectively attached to the sidewalls 13 of the container 10 and aligned with the corresponding outlets 132, two air ducts 33 arranged between the sidewalls 13 and the corresponding information processing systems 20, and two cooling units 35 disposed below the raised floor 14 respectively adjacent to the sidewalls 13 of the container 10. Opposite guard plates 311 are mounted to each of the sidewalls 13, and sandwich a corresponding group of fans 31 to prevent operators from being hurt by the fans 31. Opposite ends of the air ducts 33 respectively abut against a corresponding sidewall 13 and sides of the corresponding information processing systems facing the corresponding sidewall 13. Therefore, in the container 10, there are two hot aisles 101 defined among the corresponding air ducts 33 and the raised floor 14, and a cold aisle 102 above the raised floor 14 outside of the hot aisles 101. The cold aisle 102 is communicated with the openings 142 of the raised floor 14.

In use, the fans 31 drive the air in the cold aisle 102 to flow into the information processing systems 20. The air, carrying heat generated by the systems 20, is dissipated out of the systems 20 into the corresponding hot aisles 101. The air in the hot aisles 101 is guided to the corresponding outlets 132, and exhausted out of the container 10 by the corresponding fans 31. When the air in the cold aisle 102 flows out of the aisle 102, there is an air pressure difference between the cold aisle 102 and the space below the raised floor 14. Due to the air pressure difference, air outside of the container 10 flows into the container 10 through the intakes 131 to be cooled and dehumidified by the cooling unit, and then flows into the cold aisle 102 through the openings 142 of the raised floor 14.

The fans 31 are attached to the sidewalls 13 of the container 10, instead of being mounted in the information processing devices in a traditional design, which allows for the use of relatively larger fans, which are more efficient than small fans. At the same time, the air ducts 33 separate the hot aisles 101 and the cold aisle 102, and direct airflow generated by the fans 31 to the corresponding information processing systems 20 where it is most needed and will work most efficiently. In one embodiment, the cooling units 35 cool the air flowing into the container 10 from outside, instead of directly cooling the hot air exhausted from the information processing systems in a traditional design, therefore, the cooling units 35 in the embodiment are used more economically than the cooling units in the traditional design.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A container data center comprising:

a container comprising a top wall, a bottom wall opposite to the top wall, and opposite sidewalls connected between the top wall and the bottom wall, and a raised floor close to the bottom wall, each of the sidewalls defining an outlet and at least one intake respectively above and below the raised floor, the raised floor defines a plurality of openings;

a plurality of information processing systems installed in the container, supported on the raised floor, and arranged in two parallel rows respectively at opposite sides of the plurality of the openings of the raised floor and adjacent to the sidewalls of the container; and a heat dissipation system comprising two groups of fans respectively attached to the sidewalls of the container and aligned with the outlets of the container, and two air ducts respectively arranged between the sidewalls and the information processing systems;

wherein air outside the container flows into the container through the intakes of the container to cool the information processing systems, and is guided to the outlets of the container through the corresponding air ducts, to be exhausted out of the container by the fans.

2. The container data center of claim 1, wherein opposite ends of each of the air ducts respectively abut against a corresponding sidewall and sides of the corresponding information processing systems facing the corresponding sidewall.

3. The container data center of claim 2, wherein two hot aisles are defined in the container among corresponding air ducts and the raised floor, a cold aisle is defined in the container above the raised floor and outside of the hot aisles, the hot aisles are communicated with the corresponding outlet of the container, the cold aisle is communicated with the opening of the raised floor, the air flows through the information processing system from the cold aisle into the corresponding hot aisle.

4. The container data center of claim 1, wherein the heat dissipation system further comprises two cooling units arranged below the raised floor respectively adjacent to the intakes of the container, to cool and dehumidify the air flowing into the container.

5. The container data center of claim 1, wherein two air filters are mounted to the container to respectively cover the intakes of the container.

6. The container data center of claim 1, wherein there is no fan arranged in any of the information processing systems.

7. The container data center of claim 1, wherein opposite guard plates are mounted to each of the sidewall of the container, and sandwich a corresponding group of fans to prevent operators from being hurt by the fans.

* * * * *